United States Patent

Kanaya et al.

[11] Patent Number: 5,543,612
[45] Date of Patent: Aug. 6, 1996

[54] IMAGE PICKUP DEVICE WITH ATTACHED INTERFERENCE STRIPE NOISE PREVENTION MECHANISM

[75] Inventors: Motonori Kanaya, Omiya; Kenichi Noguchi, Ageo; Yoshiaki Nagaya, Funabashi; Hisashi Itoh, Ami-machi, all of Japan

[73] Assignees: Texas Instruments Incorporated, Dallas, Tex.; Fuji Photo Optical Co., Ltd.; Hitachi Denshi Kabushiki Kaisha, both of Japan

[21] Appl. No.: 242,226

[22] Filed: May 13, 1994

[51] Int. Cl.⁶ .................................................. H01J 40/14
[52] U.S. Cl. ...................................... 250/208.1; 250/216
[58] Field of Search ........................... 250/208.1, 208.2, 250/214.1, 214 C, 216

[56] References Cited

U.S. PATENT DOCUMENTS

| | | | |
|---|---|---|---|
| 4,401,887 | 8/1983 | Finley et al. | 250/216 |
| 4,633,078 | 12/1986 | Ferber | 250/216 |
| 5,302,818 | 4/1994 | Pezant | 250/216 |
| 5,334,829 | 8/1994 | Ueno et al. | 250/208.1 |

FOREIGN PATENT DOCUMENTS 3-188680A  8/1991  Japan.

*Primary Examiner*—Stephone B. Allen
*Attorney, Agent, or Firm*—William E. Hiller; Richard L. Donaldson

[57] ABSTRACT

An image pickup device providing favorable images which effectively suppress the interference stripe noise originating in the interference stripes created on an image sensor surface of the image pickup device. The image pickup device includes an image sensor 3 and an overlying lid glass 2. By providing a prescribed inclination angle with respect to the relative position of the image sensor 3 and the lid glass 2 protecting it, the same number of interference stripes are provided with respect to each constitutional image-defining element within the image sensor 3, and prevention of interference stripe noise is achieved by leveling the average light intensity each constitutional image-defining element receives so that sensitizing of interference stripe noise does not occur at the specific elements.

9 Claims, 6 Drawing Sheets

IMAGE PICKUP DEVICE WITH ATTACHED INTERFERENCE STRIPE NOISE PREVENTION MECHANISM

The present invention relates to an image pickup device which uses coherent light such as a laser beam and executes photography of various objects to be photographed using an image sensor in the form of a charge coupled device. In particular, the invention relates to an image pickup device with attached interference stripe noise prevention mechanism which can eliminate the interference stripe noise in the image obtained with a laser interference measuring instrument, etc.

Conventionally, white light has been often used as the light made incident on the image sensor. White light has hardly any interference properties and there is no generation of image noise caused by an interference function, but image noise was generated by reflection. Namely, as image noise, ghost images originating in the back and front surface reflection (B in FIG. 12, etc.) of the lid glass arranged right in front of the image sensor, and a ghost image generated by intersurface reflection (C in FIG. 12, etc.) of the image sensor and the lid glass, etc., can be considered.

Therefore, in order to prevent the generation of image noise by reducing the luminous energy forming such a ghost image, normally, a wide band reflection prevention film was adhered to both surfaces of the lid glass along with arranging the lid glass and the image sensor surfaces to be as parallel as possible in order to achieve reduction in the image noise by conforming the ghost image and the necessary true image.

Namely, the conventional image pickup device has image sensor 100 fixed to package 105, and with the objective of preventing lapse time performance deterioration of image sensor 100 caused by external atmosphere, lid glass (cover glass) 102 is fixed to the package 105 to cover the concave part of package 105 fixed with the image sensor 100 and is sealing the concave part of package 105 as shown in FIGS. 11(*a*) and (*b*). Also, dry nitrogen gas is sealed in sealed space 103 constituted with lid glass 102 and image sensor 100. The package 105 fixed with the image sensor 100 is stored in socket 101, and filter 104 for spectral sensitivity correction is provided at the opening part of socket 101 where the light is made incident.

The image sensor 100 is a frame transfer type of element and is structured as shown in FIGS. 15(*a*) and (*b*). 1 pixel of image sensor 100 is the X–Y area in the figures and the part which senses the light is the L–Y area. Here, the dimension of X and Y is, for example, about 8.5 μm for X and about 19.75 μm for Y.

In FIGS. 15(*a*) and 15(*b*), 100A indicates the image part, 100B the storage part, SR the serial register, CS the channel stop, and TE the electrode.

However, the image elimination means in the conventional method aims to prevent the ghost image (double image) and is not effective with respect to interference stripe noise which differs in the manner of its generation. In consideration of interference stripe noise, the following aspects are of interest.

(1) The lid glass is mounted more or less parallel to the image sensor surface; thus, when a laser beam, etc., with favorable interference properties is used as a light source, interference stripes with stripe intervals corresponding to the parallel property are created on the image sensor surface and the strength of the light intensity based on the interference stripes is superimposed on the image information as noise. Namely, interference stripe noise may be generated. With regard to this, explanation will be given in detail while referring to FIGS. 11 and 12. FIG. 12 is a figure showing the optical path between lid glass 102 and image sensor 100.

Coherent light CR made incident from the front of lid glass 102 reaches image sensor 100 by being refracted and transmitted by lid glass 102. There it is twice reflected at the front and rear surfaces of lid glass 102 and returns to image sensor 100. The intensity of light attenuates as said reflection and refraction is repeated. When the intensity of light reaching image sensor 100 is considered in a state of relatively low attenuation, it becomes Intensity $I_A$ of beam A=I $(1-r)^2$ Intensity $I_B$ of beam B=I $(1-r)^2 \cdot r^2$ Intensity $I_C$ of beam C=I $(1-r)^2 \cdot r \cdot R$ Intensity $I_D$ of beam D=I $(1-r)^4 \cdot r \cdot R$.

When the incident light intensity is I, reflectance of reflection prevention film provided on both surfaces of lid glass 102 is r, and surface reflectance of image sensor 100 is R. Generally, reflectance r of the reflection prevention film is 0.2–0.3% and reflectance R of the image sensor is a few 10%. Therefore, the intensity of beams A, B, C, and D is in the order of $$I_A > I_C > I_D > I_B$$

and it means that $I_A$ has intensity of about $1 \times 10^3$ magnification of $I_c$ and $I_D$, $I_c$ and $I_D$ are about the same, and $I_A$ is about $2.5 \times 10^5$ of $I_B$.

(2) The wide band reflection prevention film provided on the lid glass cannot totally prevent the reflection and normally, reflection of 0.2–0.3% remains. Therefore, at the image sensor surface, the first beam A reaching the image sensor surface by transmission through the lid glass and the second and third beams C and D in which the beam is returned to the lid glass surface again by being partially reflected at the image sensor surface, reflected at the front surface and the back surface of the lid glass and reaching the image sensor surface again, may interfere and form interference stripes, and this type of phenomenon cannot be avoided in principle. This will be explained in detail while referring to FIG. 13.

A schematic diagram of double luminous flux interference stripe generation is shown in FIG. 13.

Pitch P of the double luminous flux interference stripe generated when luminous fluxes 1 and 2 with coherent wavelength λ are made incident, one of them vertically and the other with angle θ, is defined as follows.

$$P = \lambda / \sin \theta$$

The double luminous flux interference stripe generated by the four beams of A, B, C, and D becomes six sets of A,B, A,C, A,D, B,C, B,D, and C,D when combined.

However, the intensity $I_B$ of beam B is very weak, so the interference stripe originating in beam B can be ignored. Therefore, the three sets of interference stripes cannot be recognized by the three beams of A, C, and D. Generally, contrast of the interference stripes formed with coherent light of intensity $I_1$ and $I_2$ can be defined as follows.

When $I_{max}$: maximum value of the light intensity, $I_{min}$: minimum value of the light intensity, $$\text{contrast } C = (I_{max} - I_{min})/(I_{max} + I_{min})$$

Here, when $I_1 > I_2$, $$I_{max}=(3\ I_2+I_1)/2$$

$$I_{min}=(I_1-I_2)/2$$

$$C=2\ I_2/(I_1+I_2)$$

Here, the contrast created by beams A and C is $C_{AC}=2r\cdot R/(1+r\cdot R)$

Contrast $C_{AD}$ created by beams A and D is, $$C_{AD}=\frac{2r\cdot R}{\frac{1}{(1-r)^2}+r\cdot R} \quad (1)$$

Contrast $C_{CD}$ created by beams C and D is, $$C_{CD}=\frac{2}{\frac{1}{(1-r)^2}+1} \quad (2)$$

In interference streak created with beams C and D, the contrast is more or less equal to 1 and the sharpness is high but in actuality, beam A exists in the background so the essential contrast $C_{CD}$ is low and becomes approximately, $$[C_{CD}]=\frac{2r\cdot R}{\frac{1}{(1-r)^2}+r\cdot R+r\cdot R+\frac{1}{(1-r)^2}} \quad (3)$$

Here, reflectance r of reflection prevention film is very small so when considered as $$1/(1-r)^2\cong 1 \quad (4)$$

it becomes $$[C_{CD}]=r\cdot R/(0.5+r\cdot R).$$

Also, similarly $C_{AD}=2r\cdot R/(1+r\cdot R)$, and it is apparent that a contrast interference stripe more or less equal to $C_{AC}=2r\cdot R/(1+r\cdot R)$ is generated.

The pitch of double luminous flux interference stripe explained for FIG. 13 can be defined with $P=\lambda/\sin\theta$ so the interference stripe pitch of double luminous flux made incident at angle $\theta=0$ becomes infinite, is not recognized as interference stripe noise, and the brightness of the screen changes.

When the interference stripe formed by the reflected light from the back and front surfaces of lid glass 102 is considered, interference stripe noise does not appear on the screen if the parallelism of lid glass 102 is made favorable and

[(generated stripe pitch)/2]>[length direction measurement in the vertical and horizontal directions of the effective screen in the image sensor element]

For example, when the size in the longitudinal direction of the effective screen in the image sensor is 12.5 mm, $\lambda=0.63$ μm, finish the parallelism (measure of $\alpha=\theta/2$) of front and rear surfaces of the lid glass to within $\alpha=2.6$ seconds calculated with $0.63\times 10^{-3}/2\sin 2\alpha>12.5$.

However, image sensor 100 and lid glass 102 are fixed with an adhesive to package 105 so it is difficult to adhere image sensor 100 and lid glass 102 to be perfectly parallel in the adhesion process. Also, lid glass 102 cannot be made perfectly flat since it is thin even if it is possible to process with favorable parallelism and it is not possible to avoid the generation of a parallelism defect with the image sensor 100.

Based on this situation, the two types of interference stripes of beams A and C, A and D explained with respect to FIG. 12 remain. However, if parallelism of lid glass 102 is processed with favorable parallelism to be within 2.6 seconds, it will pass more or less the same optical path as beams C and D and only one type of interference stripe noise will be generated. Namely, if interference stripe noise generated by beams A and C can be prevented, it is possible at the same time to prevent the interference stripe noise generated by beams A and D.

For the image sensor to recognize the interference stripes, a part that receives dark stripes such as $P_1$, $P_2$, $P_5$, and $P_6$ out of the constitutional pixels and one that receives bright stripes such as $P_3$ and $P_4$ need to exist as shown in FIG. 14. As noted previously, it is very difficult to arrange image sensor 100 and lid glass 102 to be perfectly parallel, so interference stripe noise is generated unavoidably between $P_1-P_4$ in FIG. 14.

Therefore, it is an object of the present invention to provide an image pickup device with an attached interference stripe noise prevention mechanism which can prevent the interference stripe noise seen on the screen when displaying information projected by an image sensor such as a change coupled device, etc., along with preventing the generation of a disturbance in the normal information by making the average intensity of the light received by each pixel equal and preventing it from being recognized as interference stripe noise.

SUMMARY OF THE INVENTION

In accordance with the invention, an image pickup device with an attached interference stripe noise prevention mechanism is provided in which the lid glass surface is slanted with respect to the image sensor light-receiving surface so that at least one interference stripe is generated by the reflected light reflected from the light-receiving surface of the image sensor then reflected at the lid glass surface protecting the light-receiving surface of said image sensor and the incident light reaching said light-receiving surface by transmission through the lid glass, on one pixel in the image sensor surface, in the image pickup device which is arranged with many charge coupled elements one-dimensionally or two-dimensionally, provided with an image sensor integrated with circuits for successively reading said elements on a substrate, and it photographs an object to be photographed with the image sensor.

The present invention achieves an enhancement in the density of the double luminous flux interference stripes generated by the interference function of the beams directly reaching the image sensor surface and the beams reaching the image sensor surface by being reflected at the image sensor surface and being reflected again by the lid glass by slanting the lid glass with respect to the image sensor surface by more than a prescribed angle, and in this way, at least one interference stripe is generated within one constitutional element (1 pixel) of the image sensor in achieving uniformity in the signal level from each pixel.

BRIEF DESCRIPTION OF THE DRAWINGS

FIG. 1(*b*) is an exploded perspective view of the image pickup device of FIG. 1(*a*).

FIG. 2(*b*) is a partial top view of the image sensor showing in detail the image part of the image sensor in the first embodiment.

Figure 1A:
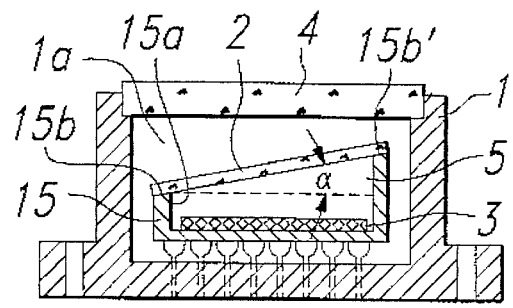
FIG. 1(*a*) is a cross-sectional view of an image pickup device with an attached interference stripe noise prevention mechanism in a first embodiment of the invention.

Reference numerals as shown in the drawings:

2, 6, 7, 8 . . . lid glass, 3 . . . image sensor, 15, 15', 15" . . . package.

DESCRIPTION OF THE PREFERRED EMBODIMENTS

Figure 1B:
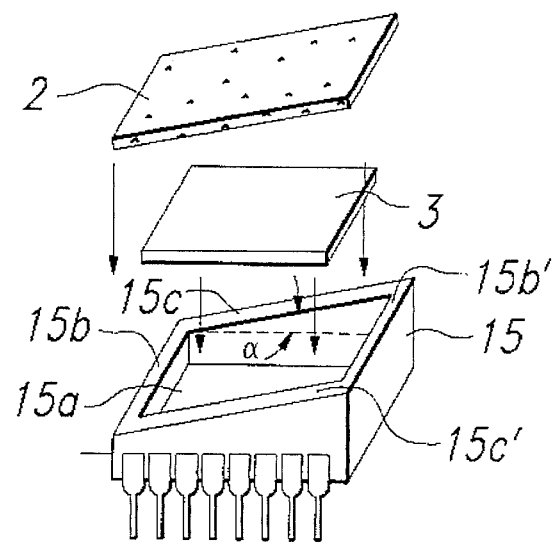
Figure 15A:
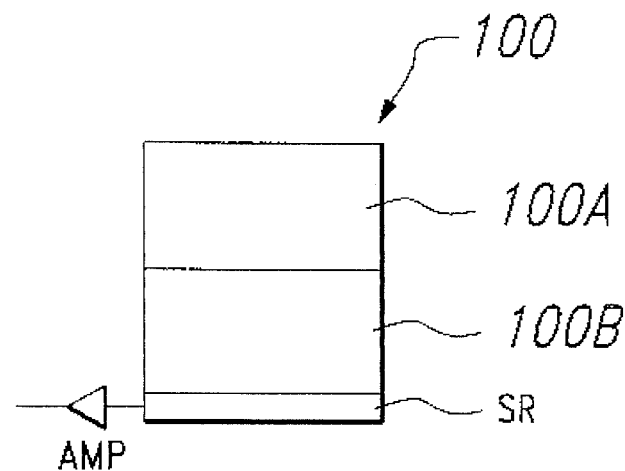
FIG. 15(a) is a schematic view showing the components of the image sensor.
Figure 15B:
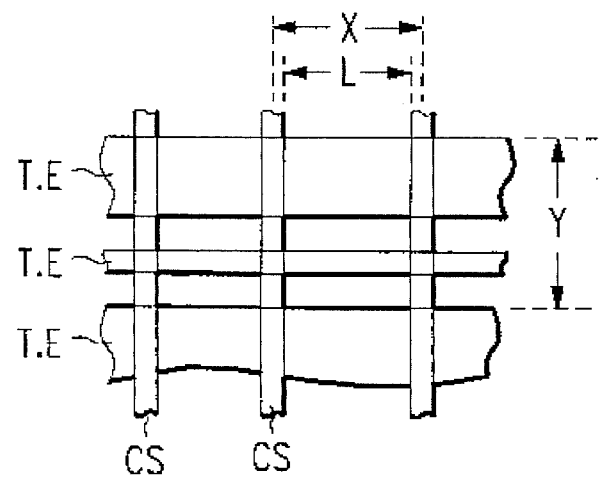
FIG. 15(b) is a schematic view showing the top of the image sensor.

FIG. 1 illustrates a first embodiment of an image pickup device appended with interference stripe noise prevention mechanism in accordance with the invention. The image pickup device includes a sealing lid glass 2 and an image sensor 3 in a package 15 wherein the lid glass is mounted so as to be slanted by angle $\alpha$ to satisfy relationship to be explained later. The mounting package 15 and a filter 4 are mounted with respect to a socket 1 so that the filter 4 for spectral sensitivity correction takes on a parallel state with respect to image sensor 3, and sealed space 5 formed with lid glass 2 and image sensor 3 forms a wedge shape. Image sensor 3 is a frame transfer type of element and the structure is as shown in FIG. 15, explained earlier.

Package 15 is fixed with image sensor 3 within concave part 15a and lid glass 2 is fixed to cover the concave part 15a. Mounting part 15b' forming one edge of the top surface where lid glass 2 is fixed is higher than the opposite edge 15b by an amount corresponding to angle $\alpha$, and other mounting parts 15c and 15c' are formed so as to have the same slant as inclination angle $\alpha$.

Image sensor 3 is placed in package 15 within an open hole 1a defined in the sokcet 1, and filter 4 for spectral sensitivity correction is provided to cover the open hole 1a.

By decreasing the parallelism between the image sensor 3 and the lid glass 2, the wedge-shaped space 5 is formed between the lid glass 2 and the inage sensor 3 within the package 15 and in this way, inclination angle $\alpha_0$ (=$\tan^{-1}$(D'/N·X)) of lid glass 2 and image sensor 3 is adjusted so that the pitch P of the double luminous flux interference stripe satisfies $$D \geq [(\lambda/2)+(X-L) \tan \alpha_0] \cdot N \quad (a)$$

Where,

D is the threshold value of lid glass 2 within the effective pixel area $\delta$ of image sensor 3, $\lambda$ is the wavelength of the used light with favorable interference property, and N is the effective pixel count of the image sensor.

For example, in the case of an image sensor with an effective pixel count=244 in the vertical (perpendicular) direction and effective pixel count=756 in the width (horizontal) direction, L=7 μm, Y=19.75 μm, and X=8.5 μm, inclination angle $\alpha_0$ of the image sensor 3 and lid glass 2 becomes about 2.6° obtained from $\tan \alpha_0 = (0.63 \times 10^{-3}/2)/7 \times 10^{-3}$ when $\lambda = 0.63$ μm.

Equation (a) is obtained as follows.

Figure 2A:
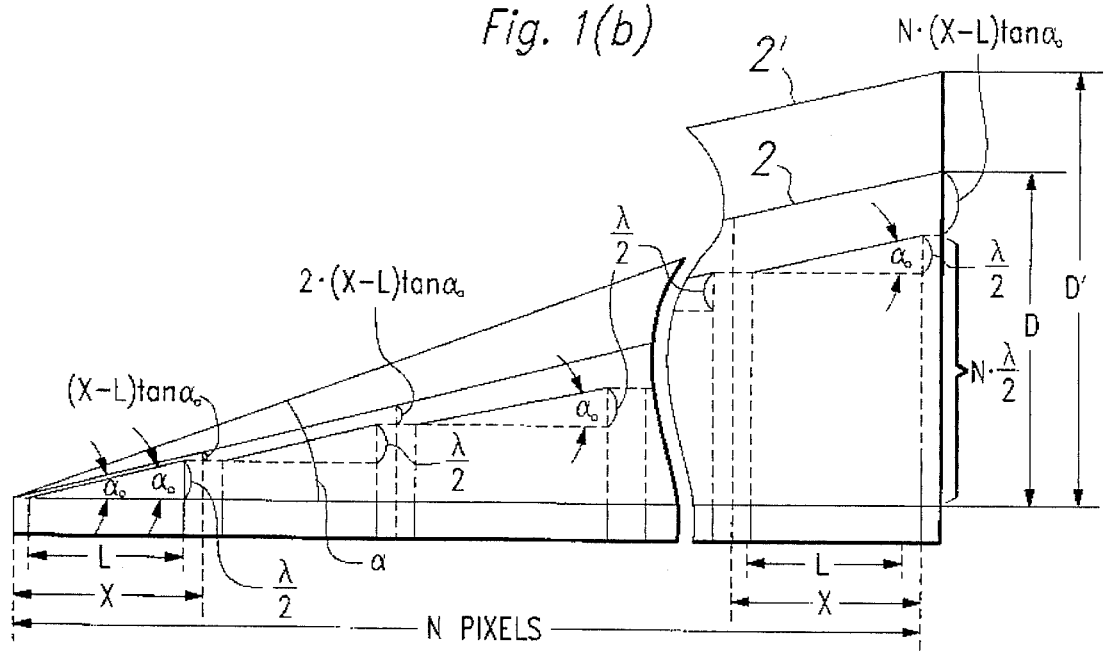
FIG. 2(*a*) is a partial side elevation view showing the relationship between the interference stripe count and the rising amount of the lid glass in the first embodiment.
FIG. 2(c) is a partial side elevation view showing an optical path illustrating a state when light is reflected between the lid glass and the image sensor.
Figure 2B:
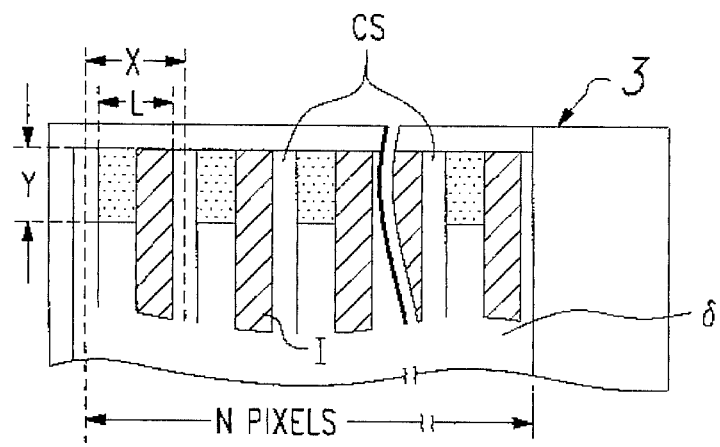
Figure 2C:
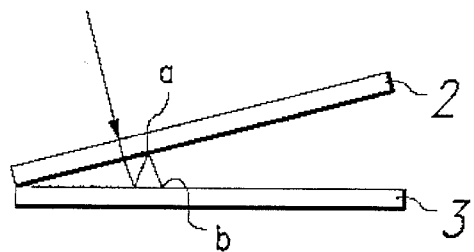

In FIG. 2(c), the interference function of the light which is transmitted through lid glass 2 and reaches the pixel in image sensor 3 and the light in which one portion of the reached light reflects at the pixel, reflects at the surface (namely, the bottom surface) on the pixel side of lid glass 2, and made incident to the pixel again will be considered. In this case, the optical path difference of two beams becomes 2 S (where S is the distance between a and b). When lid glass 2 is slanted as shown in FIG. 2(c), it is apparent that the optical path difference increases towards the right from the left in the figure.

When the optical difference is 2 S=[(M+1)/2]·$\lambda$, the interference stripe becomes dark and when 2 S=(M/2)·$\lambda$, the interference stripe becomes bright. However, M is the order of the interference stripes and M=0, 1, 2 . . . Therefore, one set of black and white interference stripes is generated each time spacing S increases one-half wavelength ($\lambda$/2).

However, when one set of black and white interference stripes 1 is formed within light-receiving part L–Y within each pixel (X–Y area) of image sensor 3 shown in FIG. 2(b), the respective brightnesses of bright stripe (white) and dark stripe (black) become a brightness average within light-receiving part L–Y area, and light-receiving part L–Y area cannot sensitize as interference stripe noise. In order to realize this type of condition, all that is necessary is to slant lid glass 2 so as to increase its slope by just optical distance of half wavelength ($\lambda$/2) worth for each pixel, and this is indicated with the solid line in FIG. 2(a). In the inclination at this time, inclination amount D of $\alpha_0 = \tan^{-1}$ (D/N·X) for lid glass 2 is expressed by D=[($\lambda$/2)+(X–L) tan $\alpha_0$]·N from one-half wavelength of beam ($\lambda$/2), dimension of the pixel (X, L), and pixel count N.

Furthermore, when the situation is elaborated, all that is necessary is to slant lid glass 2' as indicated with the alternating long-and-short-dashed line in FIG. 2(a) by more than the inclination amount D expressed with equation (a), namely, ($\alpha > \alpha_0$), in order to prevent sensitizing of interference stripe noise by averaging, and more than one set of interference stripes are formed within the light-receiving part of each pixel. In this way, the brightnesses of the bright stripes and dark stripes are averaged, and each pixel cannot be sensitized as interference stripe noise.

Figure 3:
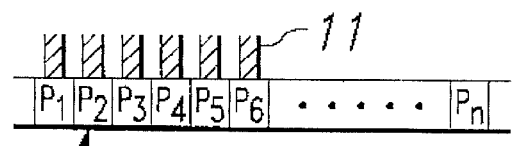
FIG. 3 is a diagrammatic view of the image sensor illustrating the principle of this invention.

By so doing, namely, by generating more than one interference stripe 11 in the light-receiving part of each pixel as shown in FIG. 3 and approximately equalizing the output signals from each pixel $P_1$, $P_2$, . . . , it is not recognized as interference stripe noise so generation as interference stripe noise can be prevented.

The present invention prevents interference stripe noise created by the relative posture of the image sensor surface and the lid glass so in regard to applying a reflection prevention film to both surfaces of the lid glass for ghost image (double image) countermeasures, in particular, applying reflection prevention film of high efficiency targeting a specific wavelength since the light source which outputs coherent light is a monochromatic light source represented by a laser, processing the lid glass to be as thin as possible and with favorable parallelism in order to reduce the aberration in the image formation, etc., they are necessary as in the conventional technology.

Next, a second embodiment of the image pickup device with an attached interference stripe noise prevention mechanism in accordance with the related invention will be described.

Figure 4:
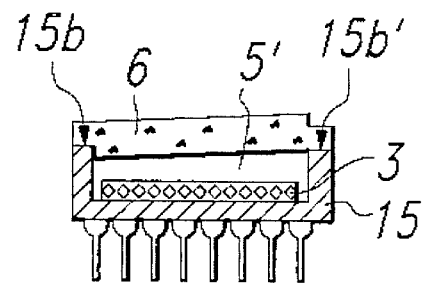
FIG. 4 is a cross-sectional view of the image pickup device with an attached interference stripe noise prevention mechanism in a second embodiment of the invention.
Figure 5A:
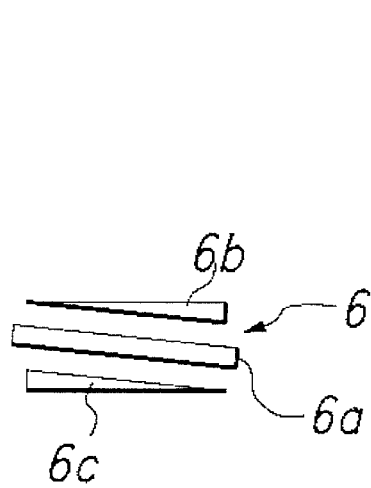
FIG. 5(a) is a side elevation view showing the sections of the lid glass used in the second embodiment of the invention.
Figure 5B:
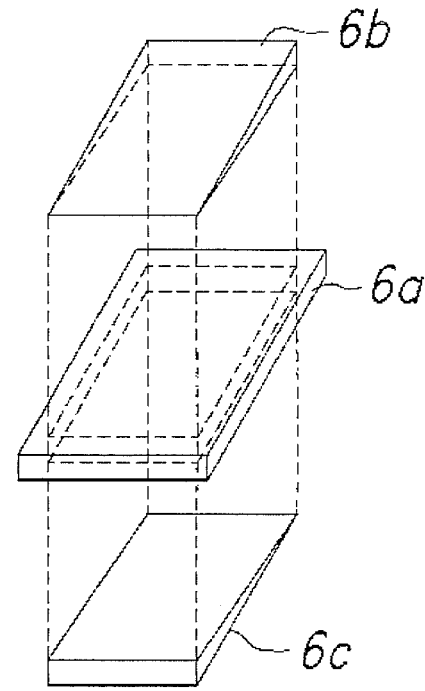
FIG. 5(b) is an exploded perspective view of the lid glass in the second embodiment.

FIG. 4 shows the second embodiment of the image pickup device in accordance with the invention, and this image pickup device is sealed with lid glass 6 in package 15 formed with mounting parts 15b and 15b' at the same height level by slanting at a prescribed angle $\alpha$, as in the first embodiment. This lid glass 6 is comprises parallel plate 6a and two wedge-shaped plates 6b and 6c adhered to both surfaces of the parallel plate 6a as shown in FIGS. 5(a) and 5(b). Both of the two wedge-shaped plates 6b and 6c are formed for the length and width to be slightly shorter than parallel plate 6a, and wedge plates 6b and 6c are adhered by leaving both end parts at both the vertical and horizontal surfaces of parallel plate 6a.

Therefore, according to the second embodiment, when fixing lid glass 6 to package 15, it is arranged in a state where the four edge parts of top, bottom, left, and right on the bottom surface of parallel plate 6a are adhered to the four edges (top surface) surrounding the concave part which is the mounting part of package 15 as in a conventional manufacturing method.

Next, a third embodiment of the image pickup device with an attached interference stripe noise prevention mechanism in accordance with the invention will be described.

Figure 6:
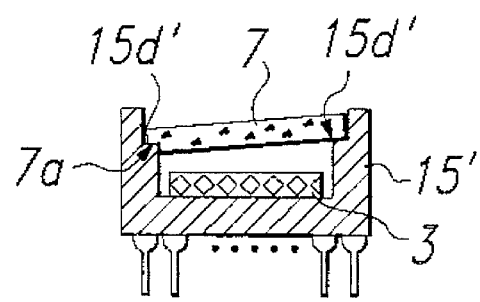
FIG. 6 is a cross-sectional view of the image pickup device with an attached interference stripe noise prevention mechanism in a third embodiment of the invention.

FIG. 6 shows the third embodiment of the image pickup device in accordance with the invention, and this image pickup device is constructed by forming a step-shaped adhesion part 7a to one side surface of lid glass 7 in order to slant lid glass 7 by a prescribed angle with respect to socket 15' formed with step-shaped mounting parts 15'd and 15'd at the same height level and to seal.

The adhesion part 7a is processed to be a prescribed depth and width coordinated to the inclination angle by a processing means such as a diamond grindstone, and is adhered while engaged with mounting part 15'd of socket 15'.

Next, a fourth embodiment of the image pickup device with an attached interference stripe noise prevention mechanism in accordance with the invention will be described.

Figure 7:
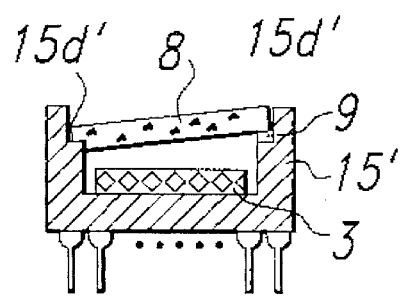
FIG. 7 is a cross-sectional view of the image pickup device with an attached interference stripe noise prevention mechanism in a fourth embodiment of the invention.
Figure 8:
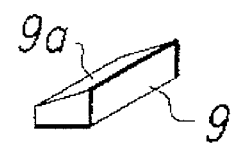
FIG. 8 is a perspective view showing a spacer used in the fourth embodiment of the invention.

FIG. 7 shows the fourth embodiment of the image pickup device in accordance with the invention, and this image pickup device has a spacer 9 as shown in FIG. 8 in one mounting part 15'd when sealing parallel plate-shaped lid glass 8 in mounting parts 15'd and 15'd formed at the same height level as socket 15'.

The spacer 9, is a rectangular polyhedron of six sides having parallel side surfaces and end surfaces with a slanted top surface 9a coordinated to the angle for slanting lid glass 8 at the desired angle.

Next, a fifth embodiment of the image pickup device appended with an interference stripe noise prevention mechanism in accordance with the invention will be described.

Figure 9:
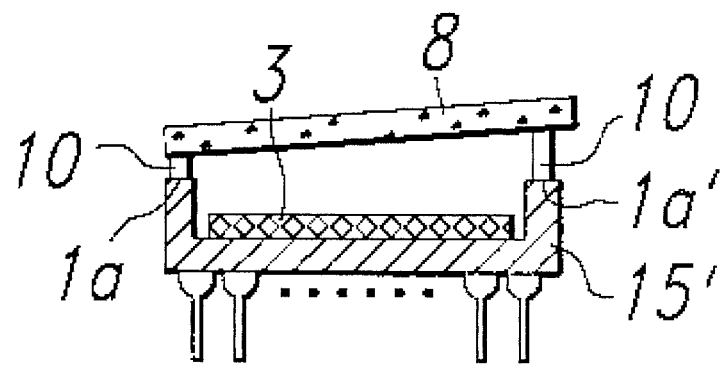
FIG. 9 is a cross-sectional view of the image pickup device with an attached interference stripe noise prevention mechanism in a fifth embodiment of the invention.
Figure 10:
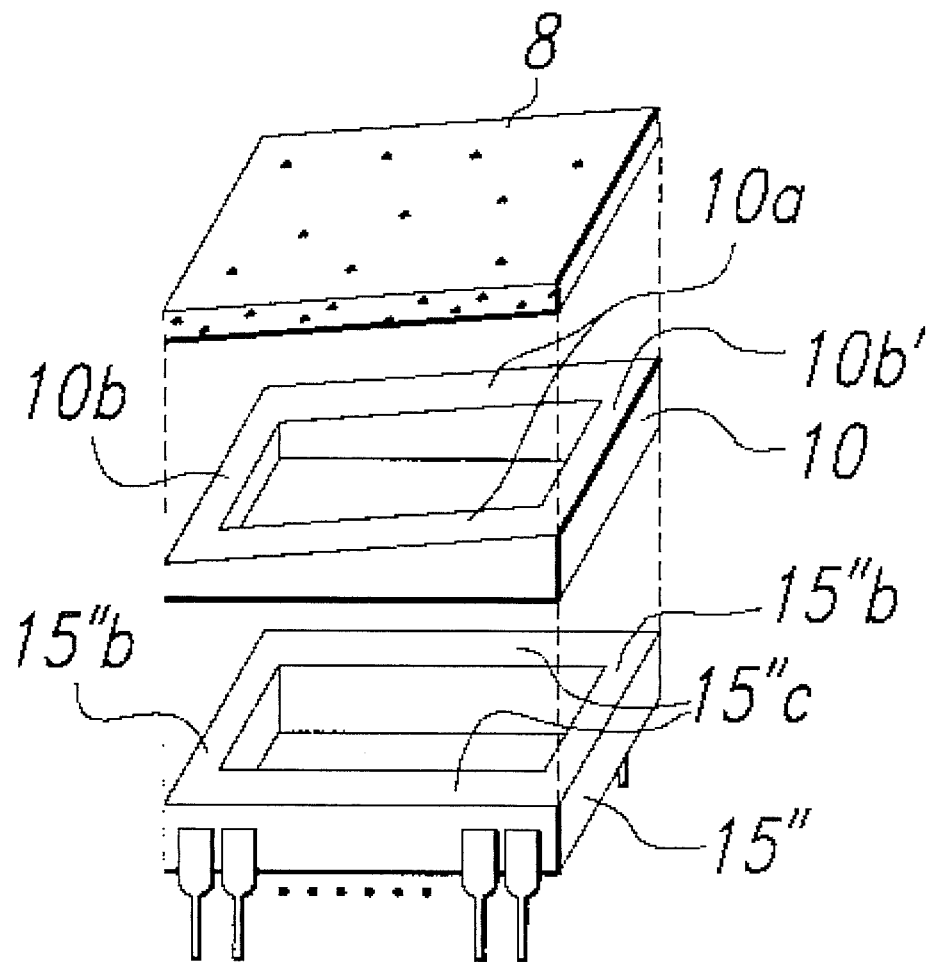
FIG. 10 is an exploded perspective view of the image pickup device with attached interference stripe noise prevention mechanism shown in FIG. 9.
Figure 11A:
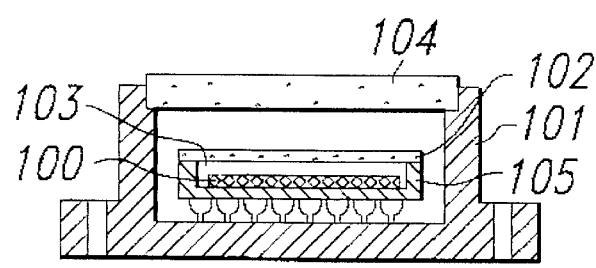
FIG. 11(a) is a cross-sectional view of a conventional image pickup device.
Figure 11B:
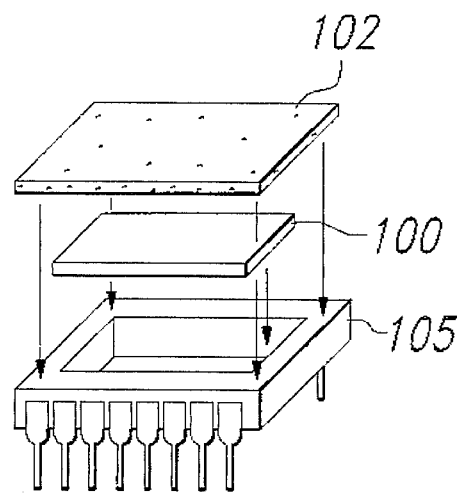
FIG. 11(b) is an exploded perspective view of the conventional image pickup device shown in FIG. 11.
Figure 12:
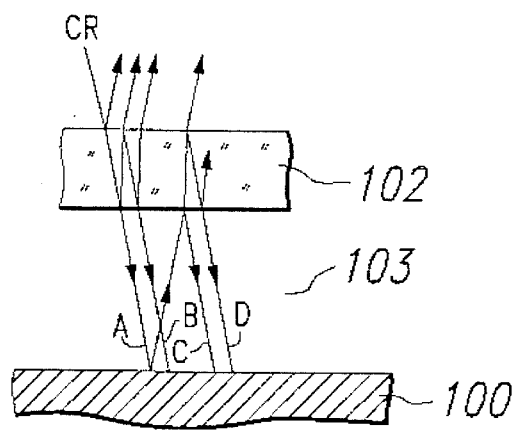
FIG. 12 is an optical path diagram showing the interference function between the lid glass and the image sensor.
Figure 13:
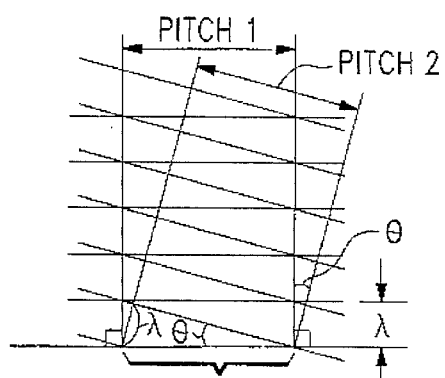
FIG. 13 is a diagrammatic view explaining the cause of double luminous flux interference stripe generation.
Figure 14:
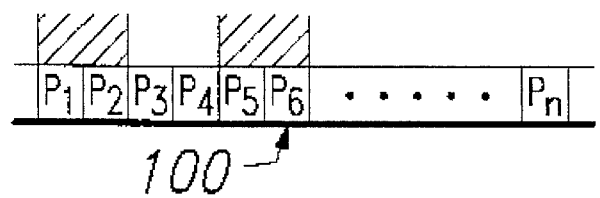
FIG. 14 is a diagrammatic view showing the interference streak formed in the image sensor in a conventional image pickup device.

FIG. 9 shows the fifth embodiment of image pickup device with an attached interference stripe noise prevention mechanism in accordance with the invention, and this image pickup device uses a substantially square-shaped hollow spacer 10 as shown in FIG. 10. The spacer 10 is defined as a peripheral endless frame and is shaped to have a top surface 10a slanted in the same angle as the angle for slanting lid glass 8 to face one end, and the thickness at one end of the spacer 10 is thicker than the other end, namely, it becomes gradually thicker in proportion to fixed inclination angle $\alpha$ from the mounting part side 10b to the side 10b'. After adhering the said spacer 10 to mounting parts 15"b and 15"c of package 15", parallel plate-shaped lid glass 8 is sealed.

Therefore, according to this fifth embodiment, the conventional package is used as is and after setting and adhering the spacer 10, lid glass 8 is adhered to spacer 10.

If the arrangement of the pixels is not equally spaced and uses, for example, an interline type of charge coupled device arranged in a number of pitches (cycles) in the embodiments according to the invention, needless to say, all that is necessary is for the inclination angle with respect to the narrow pixel pitch to satisfy the conditions noted hereinabove.

In regard to the embodiments of the invention, the interference function on the filter has not been considered but if the interference stripe noise originating in the filter has a large influence, it can be effectively solved by similarly mounting the filter with gradation.

As explained hereinabove, slanting the lid glass in one direction with respect to the image sensor element has been indicated, but all that is necessary is to generate regular approximately parallel interference stripes and for the interference stripes to be at least one for each pixel and the inclination direction need not be restricted in particular.

According to the present invention, it is possible to effectively prevent superimposition of interference stripe noise on the signal output in image photographing/recording devices, measuring instruments, particularly, laser interference measuring instruments, etc., which use a light source providing coherent light such as a laser by providing a prescribed inclination value $\alpha$ to the relative posture of the image sensor and the lid glass which protects it.

I claim:

1. An image pickup device for photographing an object with an image sensor by employing coherent light as a light source, said image pickup device comprising:

a socket having a bottom wall and opening upwardly from the bottom wall to provide a recess, at least one pin-receiving opening extending through the bottom wall;

a package assembly mounted in the recess within the socket, said package assembly including
a receptacle having a bottom wall and an upwardly opening end disposed within the recess provided by said socket, said receptacle having at least one electrically conductive pin extending from the bottom wall of the receptacle and received within said at least one pin-receiving opening in the bottom wall of said socket for electrical connection, an image sensor having a matrix of pixels disposed in the receptacle in abutment with the bottom wall thereof and adapted to receive coherent light, a lid glass disposed on the receptacle and closing the upwardly opening end thereof, a filter arranged above and in spaced relationship to said lid glass, said filter being mounted on said socket and closing the recess provided therein, and said lid glass being arranged in slanted relationship at an acute angle $\alpha$ with respect to said image sensor, the angle $\alpha$ being selected to be in a range causing interference stripe light components to occur equally on each of said pixels included in said image sensor such that a video signal output from said image sensor produced in response to coherent light being received by said image sensor is compensated with respect to noise caused by the interference stripe light components.

2. An image pickup device as set forth in claim 1, wherein the upwardly opening end of said receptacle is tapered so as to define a slanted upwardly opening end;

said lid glass being disposed in abutment with the slanted upwardly opening end of said receptacle so as to assume the slanted relationship at the acute angle $\alpha$ with respect to said image sensor.

3. An image pickup device as set forth in claim 2, wherein said receptacle has a quadrilateral cross section so as to define the upwardly opening tapering end with a four-sided slanted end surface periphery on which said lid glass is disposed.

4. An image pickup device as set forth in claim 1, wherein the upwardly opening end of said receptacle lies within a single horizontal plane so as to define a level end surface periphery;

said lid glass being disposed in abutment with the level end surface periphery of said receptacle and being of wedge shape so as to assume the slanted relationship at the acute angle $\alpha$ with respect to said image sensor.

5. An image pickup device as set forth in claim 4, wherein said wedge-shaped lid glass is segmental and comprises first and second wedge-shaped plates and an intermediate parallel plate disposed between the first and second wedge-shaped plates and having upper and lower surfaces;

said first and second wedge-shaped plates tapering in the opposite direction with respect to each other and being respectively adhered to the upper and lower surfaces of said intermediate parallel plate;

said first and second wedge-shaped plates having lengths and widths respectively shorter than the corresponding dimensions of said intermediate parallel plate; and said intermediate parallel plate of said lid glass being in abutment with the level end surface periphery of said receptacle, with said first and second wedge-shaped plates providing the slanted relationship of said lid glass at the acute angle $\alpha$ with respect to said image sensor.

6. An image pickup device as set forth in claim 1, wherein the upwardly opening end of said receptacle is provided with a counter bore so as to define a level step-shaped upwardly opening end portion;

said lid glass having a step-shaped peripheral side defined therein and being disposed in abutment with the level step-shaped upwardly opening end portion of said receptacle;

the step-shaped peripheral side of said lid glass in abutment with a corresponding part of the level step-shaped upwardly opening end portion of said receptacle cooperating therewith such that said lid glass assumes the slanted relationship at the acute angle $\alpha$ with respect to said image sensor.

7. An image pickup device as set forth in claim 1, wherein the upwardly opening end of said receptacle is provided with a counter bore so as to define a level step-shaped upwardly opening end portion;

a spacer element mounted on a part of the level step-shaped upwardly opening end portion;

said lid glass being mounted on the level step-shaped upwardly opening end portion of said receptacle; and the spacer element being interposed between and in abutment with said lid glass and said part of the level step-shaped upwardly opening end portion of said receptacle such that said lid glass assumes the slanted relationship at the acute angle $\alpha$ with respect to said image sensor.

8. An image pickup device as set forth in claim 7, wherein said spacer element is a six-sided rectangular polyhedron having a slanted top surface on which said lid glass is disposed in assuming the slanted relationship at the acute angle $\alpha$ with respect to said image sensor.

9. An image pickup device as set forth in claim 1, further including a peripheral endless spacer frame mounted on the upwardly opening end of said receptacle and having a slanted top surface arranged at the acute angle $\alpha$ with respect to said image sensor;

said lid glass being mounted on the receptacle in abutment with the slanted top surface of said peripheral endless spacer frame and closing the upper end of said receptacle.

* * * * *